US006982043B1

(12) United States Patent
Subramanian et al.

(10) Patent No.: US 6,982,043 B1
(45) Date of Patent: Jan. 3, 2006

(54) SCATTEROMETRY WITH GRATING TO OBSERVE RESIST REMOVAL RATE DURING ETCH

(75) Inventors: Ramkumar Subramanian, Sunnyvale, CA (US); Bharath Rangarajan, Santa Clara, CA (US); Catherine B. Labelle, San Jose, CA (US); Bhanwar Singh, Morgan Hill, CA (US); Christopher F. Lyons, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 367 days.

(21) Appl. No.: 10/382,181

(22) Filed: Mar. 5, 2003

(51) Int. Cl.
*B44C 1/22* (2006.01)

(52) U.S. Cl. .............................. 216/48; 216/60; 430/30; 700/19; 700/30; 700/90; 700/121

(58) Field of Classification Search .................. 700/19, 700/28, 30, 90, 121; 430/30; 216/48, 60
See application file for complete search history.

(56) References Cited

U.S. PATENT DOCUMENTS

| 6,582,863 | B1 * | 6/2003 | Stirton et al. ................. 430/30 |
| 6,643,557 | B1 * | 11/2003 | Miller et al. ................. 700/110 |
| 6,689,519 | B2 * | 2/2004 | Brown et al. .................. 430/30 |
| 6,707,562 | B1 * | 3/2004 | Lensing ...................... 356/630 |
| 6,790,570 | B1 * | 9/2004 | Stirton et al. ................. 430/30 |
| 6,819,426 | B2 * | 11/2004 | Sezginer et al. ............ 356/401 |
| 2002/0177245 | A1 * | 11/2002 | Sonderman et al. .......... 438/14 |
| 2003/0052084 | A1 * | 3/2003 | Taberty et al. ................ 216/59 |

* cited by examiner

*Primary Examiner*—Allan Olsen
(74) *Attorney, Agent, or Firm*—Amin & Turocy, LLP

(57) ABSTRACT

Disclosed are a system and method for monitoring a patterned photoresist clad-wafer structure undergoing an etch process. The system includes a semiconductor wafer structure comprising a substrate, one or more intermediate layers overlying the substrate, and a first patterned photoresist layer overlying the intermediate layers, the semiconductor wafer structure being etched through one or more openings in the photoresist layer; a wafer-etch photoresist monitoring system programmed to obtain data relating to the photoresist layer as the etch process progresses; a pattern-specific grating aligned with the wafer structure and employed in conjunction with the monitoring system, the grating having at least one of a pitch and a critical dimension identical to the first patterned photoresist layer; and a wafer processing controller operatively connected to the monitoring system and adapted to receive data from the monitoring system in order to determine adjustments to a subsequent wafer clean process.

28 Claims, 6 Drawing Sheets

SCATTEROMETRY WITH GRATING TO OBSERVE RESIST REMOVAL RATE DURING ETCH

TECHNICAL FIELD

The present invention generally relates to processing a semiconductor substrate. In particular, the present invention relates to improving a resist etch process by monitoring the resist etch process using scatterometry and a grating structure specific to the desired pitch and critical dimension as the feature being formed.

BACKGROUND ART

In the semiconductor industry, there is a continuing trend toward higher device densities. To achieve these high densities there have been, and continue to be, efforts toward scaling down device dimensions (e.g., at sub-micron levels) on semiconductor wafers. In order to accomplish such high device packing densities, smaller and smaller features sizes are required. This may include the width and spacing of interconnecting lines, spacing and diameter of contact holes, and the surface geometry, such as corners and edges, of various features. The dimensions of and between such small features can be referred to as critical dimensions (CDs).

The process of manufacturing semiconductors, or integrated circuits (commonly called ICs, or chips), typically consists of more than a hundred steps, during which hundreds of copies of an integrated circuit may be formed on a single wafer. Each step can affect the CDs of the ICs. Generally, the manufacturing process involves creating several patterned layers on and into the substrate that ultimately forms the complete integrated circuit. This layering process creates electrically active regions in and on the semiconductor wafer surface.

The requirement of small features with close spacing between adjacent features requires sophisticated manufacturing techniques, including high-resolution photolithographic processes, and controlling post development etch trim processes. Fabricating a semiconductor using such sophisticated lithography techniques may involve a series of steps including cleaning, thermal oxidation or deposition, masking, developing, etching, baking and doping. In general, lithography refers to processes for pattern transfer between various media. It is a technique used for integrated circuit fabrication in which a silicon slice, the wafer, is coated uniformly with a radiation-sensitive film, the photoresist. The photoresist coated substrate is baked to evaporate any solvent in the photoresist composition and to fix the photoresist coating onto the substrate. The baked coated surface of the substrate is next subjected to selective radiation using a mask; that is, a mask is employed to effect an image-wise exposure to radiation.

The mask permits radiation to contact certain areas of the photoresist and prevents radiation from contacting other areas of the photoresist. This selective radiation exposure causes a chemical transformation in the exposed areas of the photoresist coated surface. Types of radiation commonly used in microlithographic processes include visible light, ultraviolet (UV) light and electron beam radiant energy. After selective exposure, the photoresist coated substrate is treated with a developer solution to dissolve and remove either the radiation-exposed or the unexposed areas of the photoresist (depending upon whether a positive photoresist or a negative photoresist is utilized) resulting in a patterned or developed photoresist.

The patterned photoresist may be used in subsequent semiconductor processing such as an etch process in order to transfer its image to underlying semiconductor material layers. Examples of material layers include dielectric layers, conductive layers, and the like. When the image transfer is completed, some photoresist material may undesirably remain on the material layer. Conventional diagnostic methods involved cleaving the wafer in order to obtain information regarding the remaining photoresist material after the etch process. Thus, the wafer was wasted resulting in higher production costs and time delays in manufacturing.

SUMMARY OF THE INVENTION

The following presents a simplified summary of the invention in order to provide a basic understanding of some aspects of the invention. This summary is not an extensive overview of the invention. It is not intended to identify key or critical elements of the invention or to delineate the scope of the invention. Its sole purpose is to present some concepts of the invention in a simplified form as a prelude to the more detailed description that is presented later.

The present invention provides a system and method for reducing the extent of and/or eliminating processing steps such as wafer cleaving, wafer cleaning, and for improved control of an etch process. More specifically, the present invention provides a system and method for monitoring and controlling a removal rate of a photoresist during an etch process in order to readily determine an amount of photoresist remaining on a semiconductor wafer structure following the etch process. Consequently, cleaving the wafer may be eliminated in order to preserve the wafer for commercial use and increase overall product yield. Furthermore, information regarding an amount of photoresist remaining on the post-etch wafer may be fed forward to future semiconductor processing. For example, if an excessive amount or thickness of photoresist remains on the post-etch wafer, a user and/or semiconductor fabrication system may be instructed to employ a thinner photoresist for subsequent wafer fabrication processes. Utilizing a thinner photoresist in the etch process may lead to improved critical dimensions and may reduce the length or extent of the wafer cleaning process.

In particular, the system and method of present invention involves employing a grating structure having a pitch and critical dimensions (CDs) similar and/or identical to the feature being etched into the underlying wafer structure by way of a patterned photoresist. This may be accomplished in part by employing a scatterometry system to direct light through the grating structure and to the wafer structure and then to collect any reflected light therefrom in order to determine a quantity of photoresist material remaining on the wafer structure during and after the etch process. Other information can be extracted from this data such as a rate at which the photoresist material is removed during the etch process.

The collected data may be processed and analyzed in order to compile information which is usable to the user as well as to the overall wafer fabrication system. For example, processed data may be transmitted or fed back to any number of wafer processing controllers which can implement adjustments based on the data.

One aspect of the present invention relates to a system for monitoring a patterned photoresist clad-wafer structure undergoing an etch process. The system includes a semiconductor wafer structure comprising a substrate, one or more intermediate layers overlying the substrate, and a first patterned photoresist layer overlying the one or more intermediate layers, the semiconductor wafer structure being etched through one or more openings in the first patterned photoresist layer; a wafer-etch photoresist monitoring system programmed to obtain data relating to the patterned photoresist layer as the etch process progresses; a pattern-specific grating structure positioned over the semiconductor wafer structure and employed in conjunction with the monitoring system, the grating structure having at least one of a pitch and a critical dimension identical to the first patterned photoresist layer; and a wafer processing controller operatively connected to the monitoring system and adapted to receive data from the monitoring system in order to determine adjustments to a subsequent wafer clean process.

Another aspect of the present invention relates to a system for monitoring a patterned photoresist clad-wafer structure undergoing a first etch process. The system includes a semiconductor wafer structure comprising a substrate, one or more intermediate layers overlying the substrate, and a first patterned photoresist layer overlying the one or more intermediate layers, the semiconductor wafer structure being etched through one or more openings in the first patterned photoresist layer; a wafer-etch photoresist monitoring system programmed to obtain data corresponding to the first patterned photoresist layer as the etch process progresses; and a pattern-specific grating structure positioned over the semiconductor wafer structure and employed in conjunction with the monitoring system, the grating structure having at least one of a pitch and a critical dimension identical to the first patterned photoresist layer.

This system also includes a data processing unit operatively coupled to the monitoring system and adapted to receive data from the monitoring system to determine a thickness of a at least a second photoresist layer to be employed in at least a second etch process; a resist removal controller operatively connected to the data processing unit to receive data from the processing unit in order to determine adjustments to at least a subsequent wafer clean process; and a photoresist controller operatively connected to the monitoring system and adapted to receive data from the monitoring system to determine a thickness of at least a second photoresist layer to be employed in a subsequent etch process.

Yet another aspect of the present invention relates to a method for monitoring a patterned photoresist clad-wafer structure undergoing a first etch process. The method involves providing a wafer structure comprising a silicon substrate, one or more intermediate material layers over the substrate, and a first patterned photoresist layer overlying the one or more intermediate material layers; irradiating at least one exposed portion of the wafer structure through at least one opening in the first patterned photoresist layer to effect an image-wise transfer from the photoresist layer to the wafer structure; monitoring the first patterned photoresist layer during the image-wise transfer via a pattern-specific grating structure to obtain data relating to the photoresist layer; and according to the obtained data, determining a removal rate of the first patterned photoresist layer in order to facilitate ascertaining at least one of one or more adjustments to at least a subsequent wafer clean process and a thickness of at least a second photoresist layer to be employed in at least a second etch process.

DISCLOSURE OF INVENTION

Figure 1:
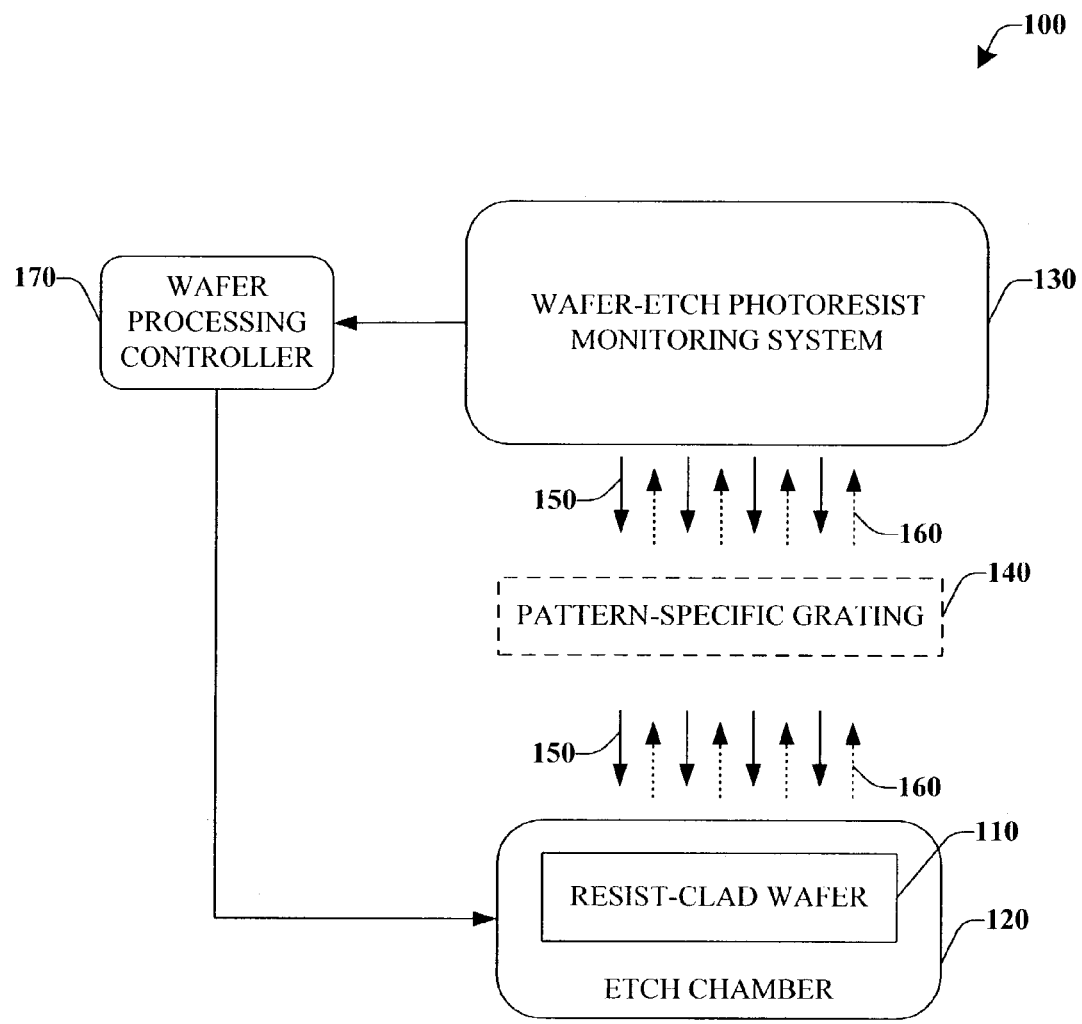
FIG. 1 illustrates a high-level schematic block diagram of a system for monitoring a photoresist during and after an etch process in accordance with an aspect of the present invention.

The present invention involves a system and method for optimizing a minimum thickness of a photoresist employed in an etch process. More specifically, the present invention provides a system and method for monitoring a removal rate of a patterned photoresist layer during a wafer-etch process. For example, a photoresist layer having a selected thickness is patterned, thereby having one or more openings therethrough which correspond to a pattern of features having a designated pitch and critical dimension. The patterned photoresist may be an uppermost layer of a semiconductor structure. In order to perform an image-wise transfer (e.g., etch process) of the pattern from the photoresist to the semiconductor structure, an etchant material or irradiation may be employed to effect a change in any one of the portions of the semiconductor structure exposed by the openings in the patterned photoresist layer. During the etch process, portions of the patterned photoresist may be partially and/or prematurely removed by an etchant material and/or irradiation utilized by the etch process without adversely affecting the pattern transfer and critical dimensions thereof.

By monitoring the removal rate of the patterned photoresist layer during the etch process, a subsequent wafer clean process may be adjusted accordingly resulting in decreased processing time and reduced resource expenditures. In addition, information gathered via the monitoring of the photoresist removal rate may also be used to adjust the thickness of a second photoresist, for example, selected for a similar (second) wafer-etch process. Thus, if the removal rate occurs relatively faster than previously anticipated and the pattern and critical dimensions of the features are compromised, then this information can indicate that a thicker photoresist should be used in the next phase of wafer processing. Conversely, if the removal rate is relatively slower than expected, a thinner photoresist may be selected for a subsequent wafer-etch process, thereby enhancing critical dimension and pattern integrity.

Monitoring the removal rate of the photoresist layer during the etch process may be accomplished in part by employing a pattern- or feature-specific grating structure in conjunction with a scatterometry system. The pattern-specific grating structure includes a pitch and critical dimensions substantially identical to the pitch and critical dimensions of the patterned photoresist layer. Moreover, the grating structure may be positioned over the wafer structure such that the pattern on the grating aligns with the patterned photoresist as desired. Therefore, cleaving the wafer structure in order to determine a photoresist removal rate (e.g., during the etch process) is no longer necessary because the removal rate may be monitored as the etch process progresses in real time. As a result, the wafer structure can be used as a product wafer, hence achieving reduced costs, waste and overall fabrication time.

The present invention will now be described in further detail with respect to exemplary FIGS. 1–7. FIGS. 1–7 merely demonstrate certain aspects of the present invention and are not intended to limit the scope of the invention.

FIG. 1 illustrates a high-level schematic block diagram of a system 100 for monitoring a removal rate of a patterned photoresist layer during a wafer-etch process. The system 100 includes a photoresist-clad wafer 110 about to undergo or may be undergoing an etch process in an etch chamber 120. The photoresist overly the wafer may already be patterned with one or more openings therein corresponding to a pattern of features at a desired pitch and critical dimensions.

During the etch process, a wafer-etch photoresist monitoring system 130 monitors the etch process and in particular the patterned photoresist. The wafer-etch photoresist monitoring system 130 monitors the photoresist layer via a pattern-specific grating 140. For example, the wafer-etch photoresist monitoring system 130 directs light as indicated by the solid arrows 150 through the pattern-specific grating 140 to the photoresist-clad wafer 10, as indicated by the solid arrows 150 and in particular, to the patterned photoresist layer thereon. Light, as indicated by the dotted arrows 160 may be reflected from the photoresist-clad wafer structure 110 to the monitoring system 130. At the monitoring system 130, the collected light data may be processed and analyzed in order to determine a removal rate of the photoresist material during the etch process.

The resulting or analyzed data can be transmitted to a wafer processing controller 170. The wafer processing controller 170 regulates wafer processing phases such as, for example, etch processes, development processes, and wafer clean processes. Using the data and information from the wafer-etch photoresist monitoring system 130, the controller 170 may determine to adjust one or more settings or parameters in the subsequent wafer clean process, for example, according to the calculated amount of photoresist material remaining on the wafer structure at the conclusion of the etch process. Such adjustments to the wafer clean process may also be based on the calculated removal rate of the photoresist material as the etch process proceeds along its course. As a result, the wafer structure can be fabricated with increased efficiency and decreased waste since the wafer can be preserved and used as product.

Figure 2:
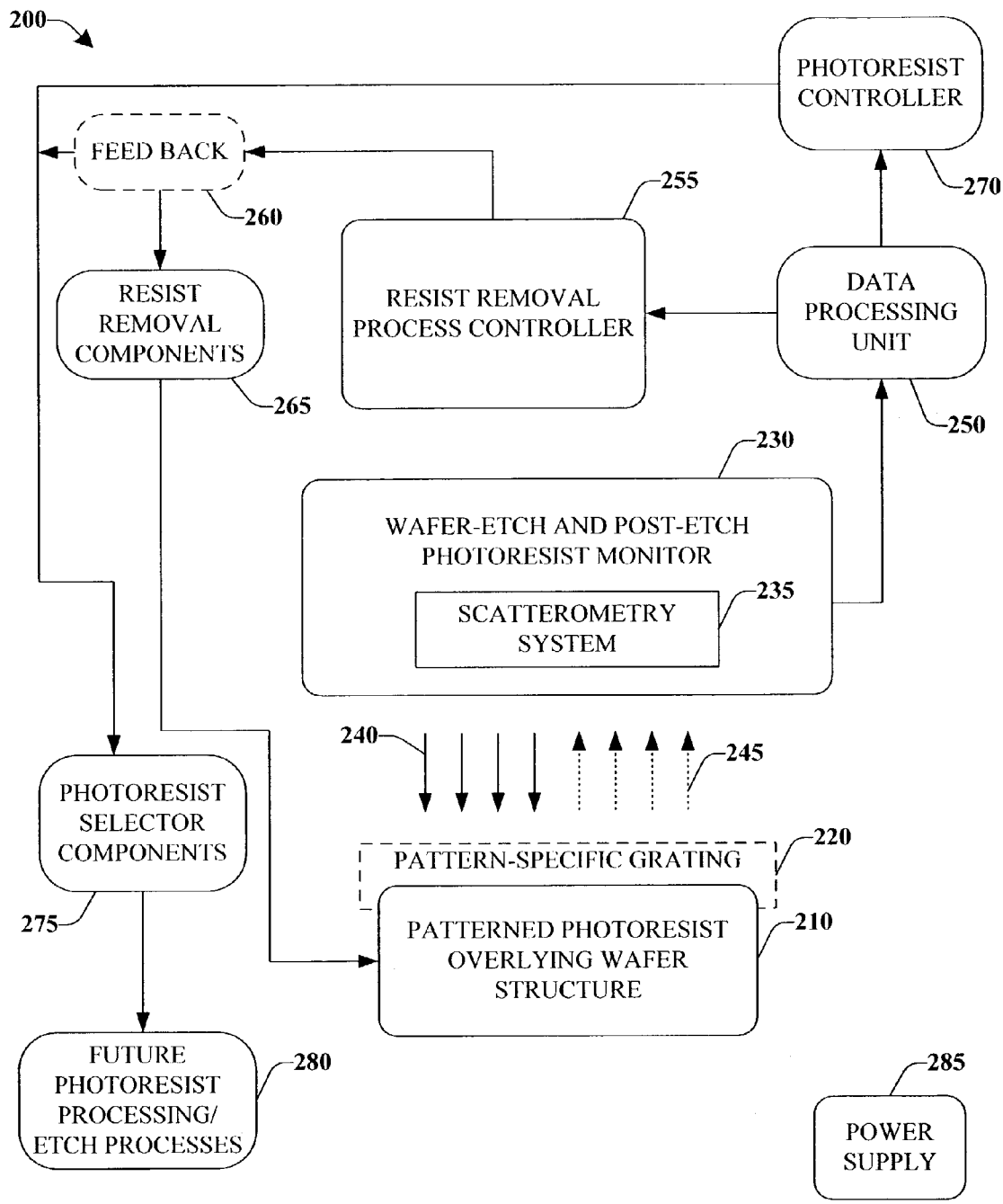
FIG. 2 illustrates a schematic block diagram of a system for monitoring a photoresist during and after an etch process in accordance with an aspect of the present invention.

FIG. 2 depicts a schematic block diagram of a system 200 for monitoring a removal rate of a patterned photoresist layer during a wafer-etch process. The system 200 includes a patterned photoresist overlying a wafer structure 210. Aligned over and/or above the wafer structure 210 is a pattern-specific grating 220 which can be used to facilitate monitoring of the patterned photoresist layer as the etch process progresses. Monitoring of the patterned photoresist layer may be accomplished in part by the wafer-etch/post-etch photoresist monitor 230. The wafer-etch/post-etch monitor 230 can employ a scatterometry system 235 in order to obtain and generate data from and with respect to the patterned photoresist. In particular, the data collected from the photoresist layer may indicate a rate at which one or more portions of photoresist material are inadvertently removed during the etch process.

For example, light 240 may be directed through the grating 220 to the photoresist layer and then reflected 245 therefrom to the monitor 230. The monitor 230 may communicate the light data to a data processing unit 250. The data processing unit 250 analyzes and manipulates the light data in order to produce resulting data corresponding to a state of the photoresist layer and to a removal rate of the photoresist material. This data may be transmitted to a resist removal process controller 255. The resist removal controller 255 determines what if any adjustments should be made to subsequent wafer processes such as a wafer clean process. Analyzed data and/or information from the data processing unit 250 may pass from the resist removal process controller 255 as feedback 260 to one or more resist removal components 265. Any adjustments can be implemented with respect to one or more of the resist removal components 265 and immediately (e.g., in real time) implemented with respect to the current wafer structure 210.

Alternatively or in addition, the data processing unit 250 may transmit resulting data and/or information to a photoresist controller 270. The photoresist controller facilitates selection of a photoresist having a desired thickness according to an upcoming etch process. Thus, if the data indicates that the rate the photoresist material is being removed during the etch process is relatively slower than expected, then the photoresist controller 270 may instruct one or more photoresist selector components 275 to select a thinner photoresist for a second etch process. The converse may apply as well if the removal rate is relatively faster than originally expected. Hence, future photoresist processing and/or etch processes 280 are optimized and variations from wafer-to-wafer and lot-to-lot may be accounted for during processing.

Furthermore, the feedback 260 by way of the resist removal process controller 255 may be directed to the one or more photoresist selector components 275 in order to implement changes to the photoresist thickness used for the particular etch process on future wafers 280. In order for the system 200 to operate as desired, a power supply 285 suitable to carry out the present invention may be selected by the user.

Figure 3:
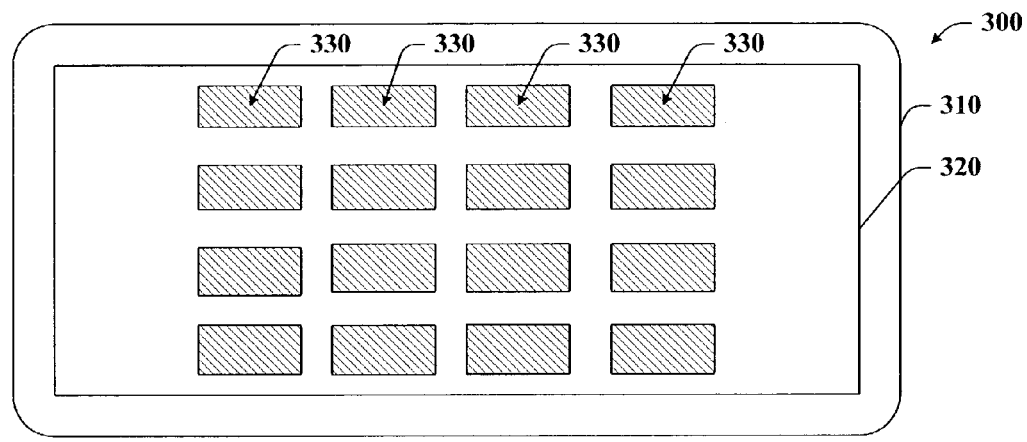
FIG. 3 illustrates a top view of an exemplary grating structure fabricated and employed in a system for monitoring a photoresist during and after an etch process in accordance with an aspect of the present invention.

FIG. 3 illustrates a top-view of an exemplary pattern-specific grating structure 300 as employed in accordance with the present invention. The grating structure 300 comprises a layer of chrome 320 formed over glass 310 and one or more openings 330 therethrough which demonstrate at least one of a pitch and critical dimensions (at least one critical dimension) that are similar, if not identical, to the pattern of features formed in the photoresist layer.

Figure 4:
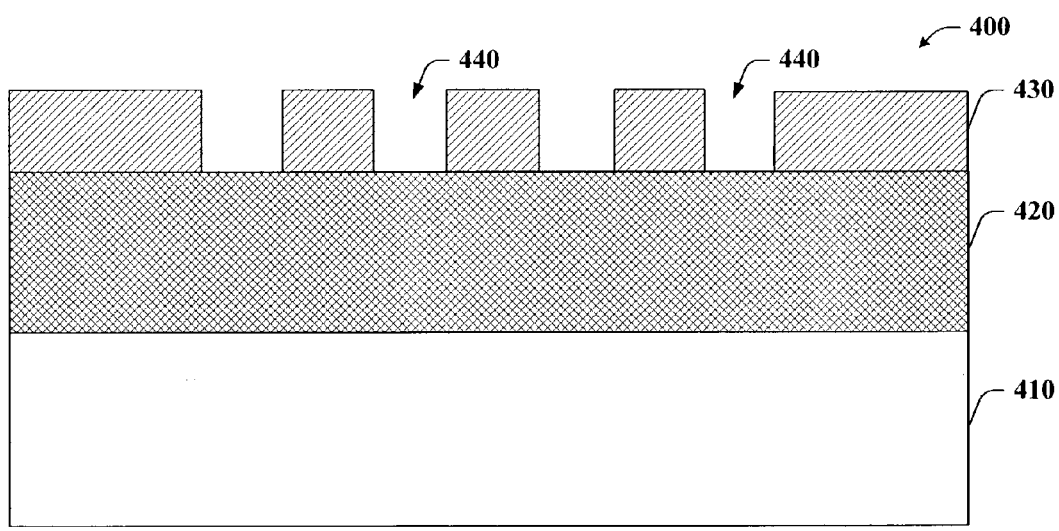
FIG. 4 illustrates a cross-sectional view of a schematic patterned photoresist-clad wafer structure employed in a system and method for monitoring a photoresist during and after an etch process in accordance with an aspect of the present invention.

FIG. 4 depicts a cross-sectional view of an exemplary wafer structure 400 as employed in accordance with the present invention. The wafer structure 400 includes a silicon substrate 410 which may be either a polycrystalline silicon material or a silicon based material. One or more intermediate layers of material 420 may be formed over the substrate 410 as shown. However, it should be understood that no intermediate layers may be formed on the structure 400 and such is intended to fall within the scope of the present invention.

Overlying the intermediate layer 420 is a patterned photoresist layer 430. the patterned photoresist layer 430 comprises one or more openings 440 therethrough which correspond to at least one pattern of features having a desired critical dimension and a desired pitch. The photoresist layer may be patterned using conventional means which for the sake of brevity, may not be discussed at this time.

Figure 5:
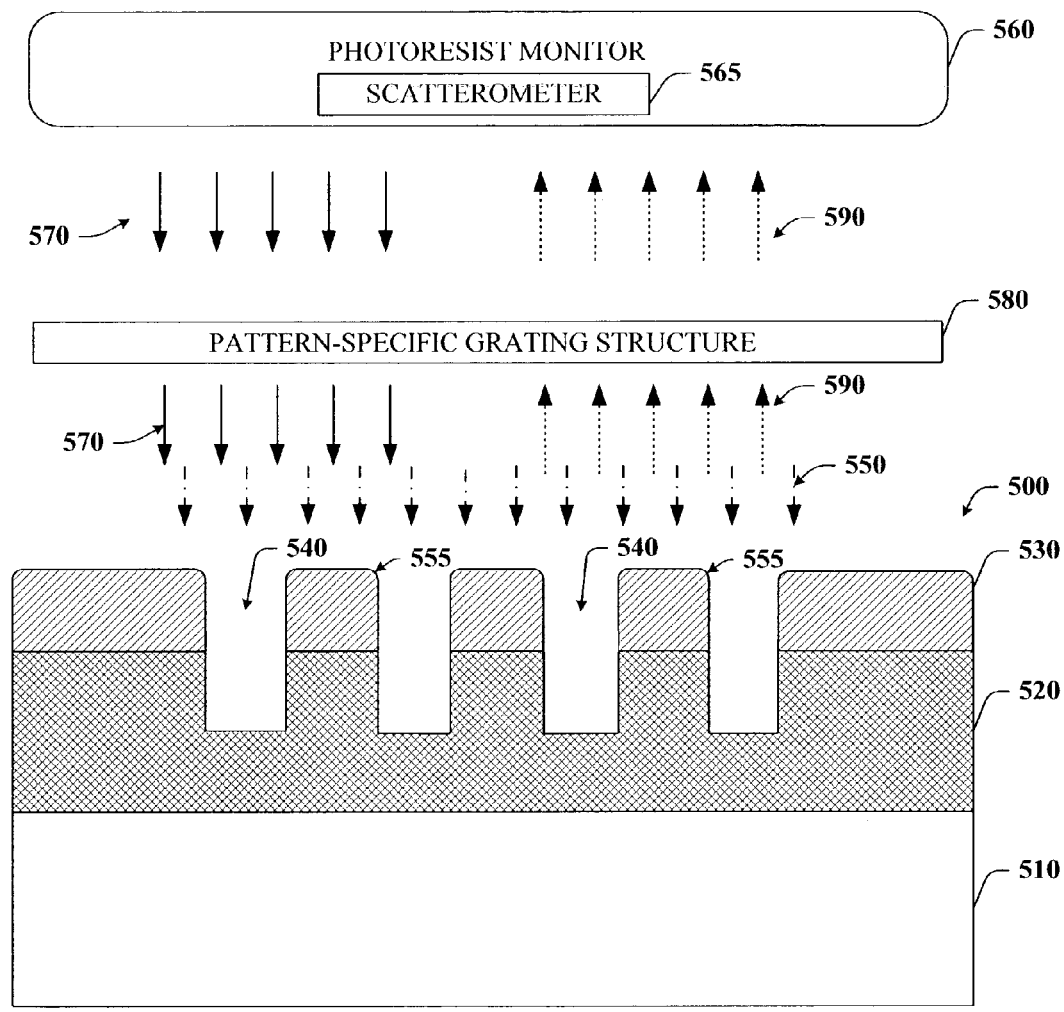
FIG. 5 illustrates a cross-sectional view of a schematic patterned photoresist-clad wafer structure undergoing an etch process in a system and method for monitoring a photoresist during and after an etch process in accordance with an aspect of the present invention.

FIG. 5 illustrates a cross-sectional view of a schematic semiconductor structure 500 undergoing an etch process. The semiconductor structure 500 includes a polycrystalline silicon substrate 510, one or more intermediate layers 520 formed over the substrate 510, and a patterned photoresist layer 530 formed over the one or more intermediate layers 520. The photoresist layer 530 comprises one or more openings 540 which correspond to one or more features 540 having a pitch as well as critical dimensions according to a desired functionality or application. The features 540 may be relatively dense as shown, thus having a lower pitch.

In the etch process, portions of the intermediate layer 520 which have been exposed through the openings 540 of the photoresist layer 530 are irradiated 550 with a suitable etchant material in order to effect an image-wise transfer of features from the photoresist layer 530 to the underlying intermediate layer 520. Due to the nature of the etchant material, some areas (e.g., as demonstrated by rounded-off corners 555) of the photoresist layer 530 may be removed gradually as the etch process progresses. In order to monitor the removal rate of the photoresist layer 530 during the wafer etch process, a photoresist monitor 560 may be employed in real time as the wafer etch process occurs.

The photoresist monitor 560 comprises a scatterometer 565 to facilitate obtaining data pertaining to the photoresist layer 530. In particular, the scatterometer 565 directs one or more incident beams of light 570 from one or more light sources (not shown) through a pattern specific grating structure 580 to contact at least a surface of the photoresist layer 530. The pattern specific grating structure 580 may be positioned over and aligned with the photoresist layer 530 as desired. The grating structure 580 comprises a pattern specific to the pattern of features 540 in the photoresist layer 530 in order to allow monitoring of the photoresist layer 530 during the wafer etch process.

One or more light receptors (not shown) may detect and receive light reflected 590 from the photoresist layer 530. The reflected light 590 can be processed and analyzed by the photoresist monitor 560 or by a data processing unit (e.g., 250 in FIG. 2) coupled thereto, depending on the user and the desired application. The processed and analyzed data may be fed back and/or fed forward in a controlled manner to various other process controllers and/or components in order optimize the overall etch process and semiconductor fabrication process.

Figure 6:
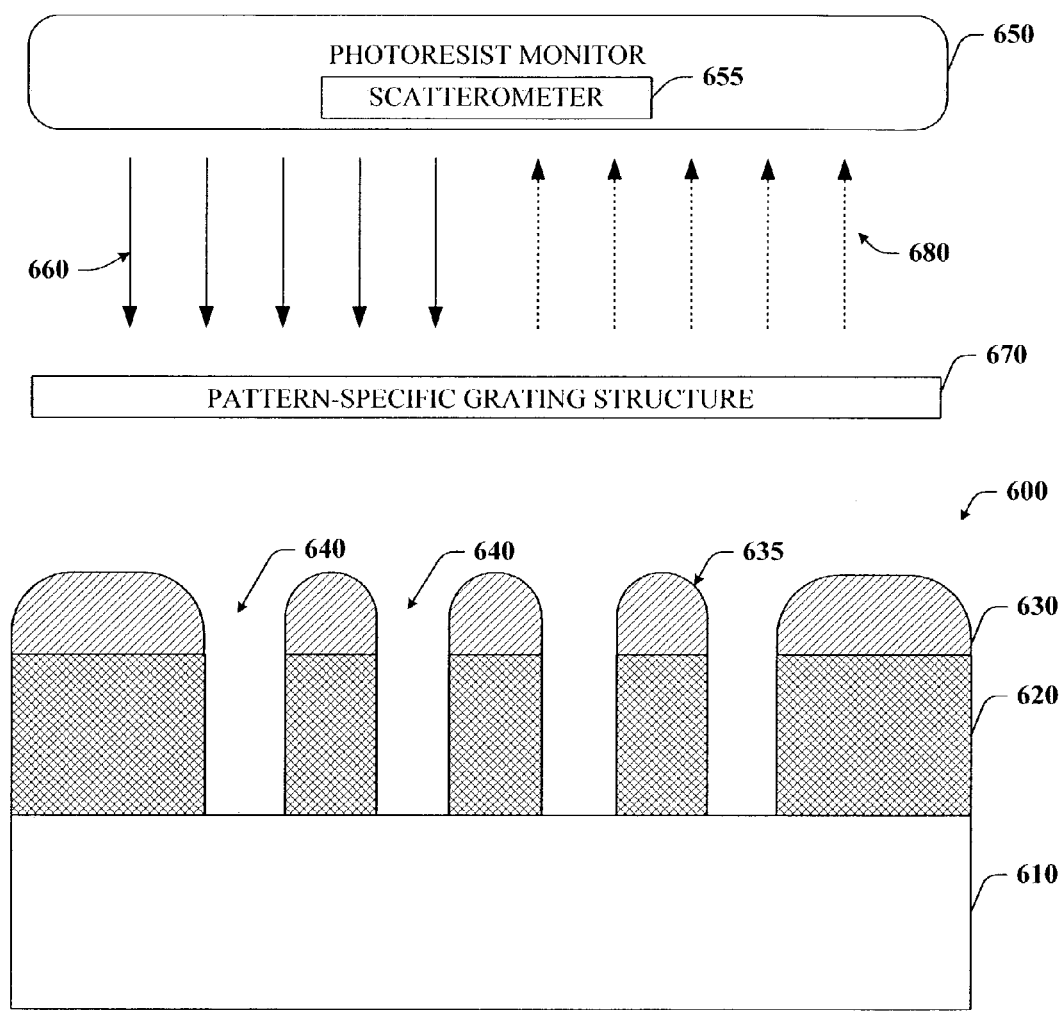
FIG. 6 illustrates the wafer structure of FIG. 5 at a subsequent stage of the etch process in a system and method for monitoring a photoresist during and after an etch process in accordance with an aspect of the present invention.

FIG. 6 depicts a wafer etch process which has been substantially completed. A cross-sectional view of an etched semiconductor structure 600 is illustrated as including a silicon-based substrate 610, an intermediate layer 620 of which selected portions have been removed by the etch process, and remaining portions of a patterned photoresist layer 630 overlying the intermediate layer 620. During the etch process, some portions of the photoresist layer 630 were unavoidable removed, thereby giving the remaining photoresist material to have a curved-corner appearance 635 to a greater extent than the photoresist layer 530 of FIG. 5.

A relatively dense feature pattern 640 has been formed into the intermediate layer 620 by the etch process. During as well as at or near the end of the etch process, the photoresist layer 630, and in particular, the removal rate thereof, can be monitored using a photoresist monitor 650 and a scatterometer 655. In particular, light 660 is directed through a pattern specific grating structure 670 to portions of the photoresist layer 630 which are visible through the grating structure 670. Light reflected 680 from the photoresist layer may be collected and analyzed by a data processing unit (e.g., 250 in FIG. 2) in order to determine the rate that photoresist material is removed during the etch process. Thus, such information may be communicated to a subsequent wafer clean process to modify one or more aspects of the wafer clean process depending on the removal rate of the photoresist material. In addition, such information may be transmitted to a future wafer etch process in order to adjust the thickness of a second photoresist employed in a similar but subsequent etch process.

Figure 7:
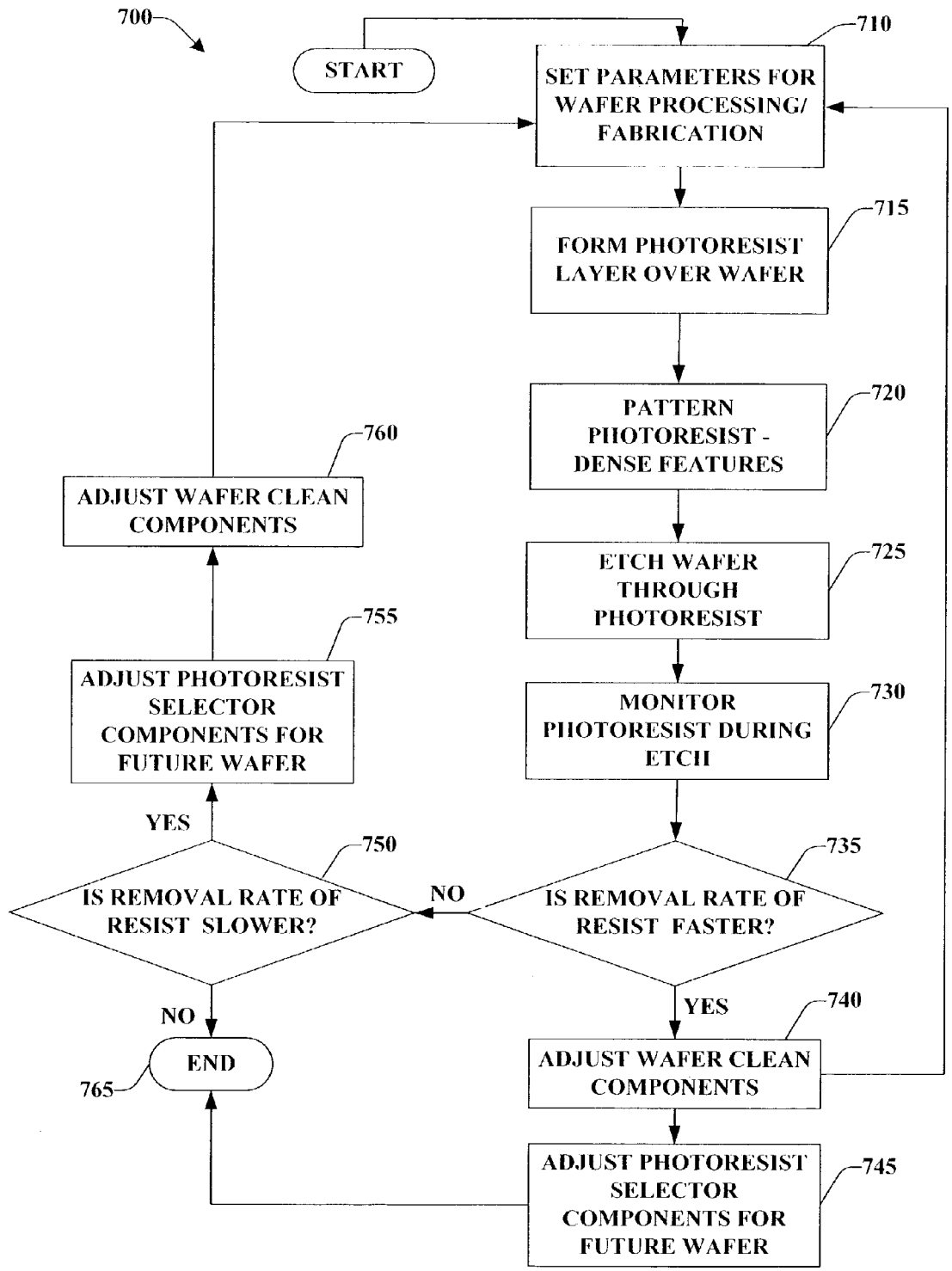
FIG. 7 illustrates a flow diagram of an exemplary method for monitoring a photoresist during and after an etch process in accordance with an aspect of the present invention.

Turning to FIG. 7, a flow diagram of an exemplary method for monitoring a patterned photoresist clad-wafer structure undergoing a first etch process is shown. The method 700 may begin with setting parameters for wafer processing in order to substantially complete fabrication of the device (at 710). Examples of such parameters include wafer layer thicknesses, wafer clean settings, etchant materials, time duration, flow rates, pressures, power, and the like. At 715, a first photoresist layer having a desired thickness may be formed over a wafer structure.

The photoresist layer can be patterned with a dense feature array, for example, at 720. At 725, exposed portions of the wafer structure may be etched through the one or more openings of the first (patterned) photoresist layer in an etch process. During the etch process or rather as the etch process is progressing, the photoresist layer may be monitored at 730, using a scatterometer, to facilitate determining a rate at which photoresist material is being removed during the etch process. In addition, monitoring may also allow determining the current thickness of the photoresist and/or the current surface/thickness uniformity of the photoresist layer.

If the obtained and analyzed data indicates at 735 that the removal rate of the photoresist is faster than anticipated, but still benign to the overall fabrication and operation of the device, then subsequent processing such as wafer clean components may be adjusted at 740 accordingly in order to conserve resources and time. Such adjustments are implemented into the parameters for the wafer processing at 710. In addition, this data may be communicated to adjust one or more photoresist selector components for future wafer processing in order employ an optimum photoresist thickness in future fabrication processes.

Alternatively, if the removal rate is not faster but rather, is slower than anticipated (at 750), the photoresist selector components may be adjusted accordingly for future wafer fabrication at 755. In particular, the required or desired thickness for a second photoresist to be used in a future process may be thinner than the first photoresist layer. Thus, wafer clean time can be minimized and transfer fidelity can be increased. A change in the thickness of a photoresist may also require other processing parameters to be adjusted accordingly.

At 760, the wafer clean components can be modified depending on the determined removal rate to facilitate increasing fabrication efficiency and accurateness. If the removal rate is neither faster or slower but as anticipated, then the method 700 may end at 765 without adjustments to system or processing components.

Although the invention has been shown and described with respect to several aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for monitoring a patterned photoresist clad-wafer structure undergoing a first etch process comprising:
   providing a wafer structure comprising a silicon substrate, one or more intermediate material layers over the substrate, and a first patterned photoresist layer overlying the one or more intermediate material layers;
   irradiating at least one exposed portion of the wafer structure through at least one opening in the first patterned photoresist layer to effect an image-wise transfer from the photoresist layer to the wafer structure;
   monitoring the first patterned photoresist layer during the image-wise transfer via a pattern-specific grating structure to obtain data relating to the photoresist layer; and
   according to the obtained data, determining a removal rate of the first patterned photoresist layer in order to facilitate ascertaining at least one of one or more adjustments to at least a subsequent wafer clean process and a thickness of at least a second photoresist layer to be employed in at least a second etch process.

2. The method of claim 1, wherein monitoring the first patterned photoresist layer comprises:
   directing one or more beams of incident light through the grating structure to contact the wafer structure; and
   collecting one or more beams of light reflected from the wafer structure.

3. The method of claim 1, wherein the data obtained via monitoring is translated into numerical values associated with at least one of thickness and removal rate of the first patterned photoresist layer.

4. The method of claim 1, further comprising feeding the data relating to the photoresist layer back to a wafer processing controller in order to make one or more adjustments to at least a wafer clean process, thereby optimizing an overall wafer fabrication process.

5. The method of claim 1, further comprising feeding the data relating to the photoresist layer forward to a photoresist controller in order to adjust a thickness of the second photoresist to be used in the second etch process.

6. The method of claim 1, further comprising adjusting one or more components according to the data obtained by monitoring the photoresist layer to conserve resources, reduce costs and production time and increase product yield.

7. The method of claim 1, wherein the first patterned photoresist layer comprises one or more features formed therein.

8. The method of claim 1, wherein the pattern-specific grating structure comprises at least one of a pitch and a critical dimension substantially identical to at least one of a pitch and a critical dimension of the first patterned photoresist layer.

9. The method of claim 1, wherein the pattern-specific grating structure is aligned with the first patterned photoresist layer.

10. The method of claim 1, wherein the data obtained via monitoring is translated into numerical values associated with a thickness of the first patterned photoresist layer.

11. The method of claim 1, wherein the data obtained via monitoring is translated into numerical values associated with a removal rate of the first patterned photoresist layer.

12. The method of claim 1, further comprising processing the obtained data to facilitate ascertaining information pertaining to the photoresist layer.

13. The method of claim 12, wherein the information comprises at least one a removal rate of photoresist material during the etch process, a thickness of the photoresist layer, and uniformity of the photoresist layer.

14. The method of claim 12, wherein the information comprises a removal rate of photoresist material during the etch process.

15. The method of claim 12, wherein the information comprises a thickness of the photoresist layer.

16. The method of claim 12, wherein the information comprises a uniformity of the photoresist layer.

17. A method for monitoring a patterned photoresist clad-wafer structure undergoing and after a first etch process comprising:
   providing a wafer structure comprising a silicon substrate, one or more intermediate material layers over the substrate, and a first patterned photoresist layer overlying the one or more intermediate material layers;
   irradiating at least one exposed portion of the wafer structure through at least one opening in the first patterned photoresist layer to effect an image-wise transfer from the photoresist layer to the wafer structure;
   monitoring the first patterned photoresist layer during and after the image-wise transfer via a pattern-specific grating structure to obtain data relating to the photoresist layer; and
   according to the obtained data, determining a removal rate of the first patterned photoresist layer in order to facilitate ascertaining at least one of one or more adjustments to at least a subsequent wafer clean process and a thickness of at least a second photoresist layer to be employed in at least a second etch process, the data obtained via monitoring is translated into numerical values associated with at least one of a thickness and a removal rate of the first patterned photoresist layer.

18. The method of claim 17, wherein monitoring the first patterned photoresist layer comprises:
   directing one or more beams of incident light through the grating structure to contact the wafer structure; and
   collecting one or more beams of light reflected from the wafer structure.

19. The method of claim 17, wherein the data obtained via monitoring is translated into numerical values associated with a thickness of the first patterned photoresist layer.

20. The method of claim 17, wherein the data obtained via monitoring is translated into numerical values associated with a removal rate of the first patterned photoresist layer.

21. The method of claim 17, further comprising feeding the data relating to the photoresist layer forward to a photoresist controller in order to adjust a thickness of the second photoresist to be used in the second etch process.

22. The method of claim 17, further comprising adjusting one or more components according to the data obtained by monitoring the photoresist layer to conserve resources, reduce costs and production time and increase product yield.

23. The method of claim 17, wherein the first patterned photoresist layer comprises one or more features formed therein.

24. The method of claim 17, wherein the pattern-specific grating structure is aligned with the first patterned photoresist layer.

25. The method of claim 17, further comprising processing the obtained data to facilitate ascertaining information pertaining to the photoresist layer.

26. The method of claim 25, wherein the information comprises a removal rate of photoresist material during the etch process.

27. The method of claim 25, wherein the information comprises a thickness of the photoresist layer.

28. The method of claim 25, wherein the information comprises a uniformity of the photoresist layer.

* * * * *